United States Patent [19]
Suzuki et al.

[11] Patent Number: 6,063,300
[45] Date of Patent: May 16, 2000

[54] METHOD OF MANUFACTURING SEMICONDUCTOR DEVICE INCLUDING LIGHT ETCHING

[75] Inventors: Miki Suzuki; Jun Kikuchi; Mitsuaki Nagasaka; Shuzo Fujimura, all of Kawasaki, Japan

[73] Assignee: Fujitsu Limited, Kawasaki, Japan

[21] Appl. No.: 09/026,695

[22] Filed: Feb. 20, 1998

[30] Foreign Application Priority Data

Mar. 19, 1997 [JP] Japan .................................. 9-066799
Jan. 30, 1998 [JP] Japan .................................. 10-019976

[51] Int. Cl.⁷ .................... H01L 21/3065; G01K 5/48; C03C 15/00; B44C 1/22

[52] U.S. Cl. .................... 216/59; 134/1.1; 134/1.2; 216/60; 216/64; 216/67; 216/72; 216/79; 216/80; 438/714; 438/715; 438/718; 438/723; 438/743; 438/756

[58] Field of Search .................... 134/1.1, 1.2; 216/64, 216/67, 72, 79, 80, 59, 60; 438/714, 715, 718, 723, 743, 756

[56] References Cited

U.S. PATENT DOCUMENTS

| | | | |
|---|---|---|---|
| 4,807,016 | 2/1989 | Douglas | 357/67 |
| 5,620,559 | 4/1997 | Kikuchi | 438/723 |
| 5,885,361 | 3/1999 | Kikuchi et al. | 134/1.1 |

FOREIGN PATENT DOCUMENTS

| | | |
|---|---|---|
| 6-338478 | 12/1994 | Japan . |
| 7-263416 | 10/1995 | Japan . |
| 8-145811 | 6/1996 | Japan . |

Primary Examiner—Rabon Sergent
Attorney, Agent, or Firm—Staas & Halsey LLP

[57] ABSTRACT

A method of manufacturing a semiconductor device, including the steps of: cooling a semiconductor wafer to a predetermined temperature, the semiconductor wafer being mounted on a stage provided with cooling means and having a thin oxide film on a surface thereof; supplying energy to gas containing hydrogen and water vapor to excite the gas into a plasma state; adding nitrogen fluoride downstream into a flow of the gas in the plasma state; and introducing a flow of the gas, including the nitrogen fluoride, to the semiconductor wafer to etch the thin oxide film while maintaining the semiconductor wafer at the predetermined temperature.

33 Claims, 7 Drawing Sheets

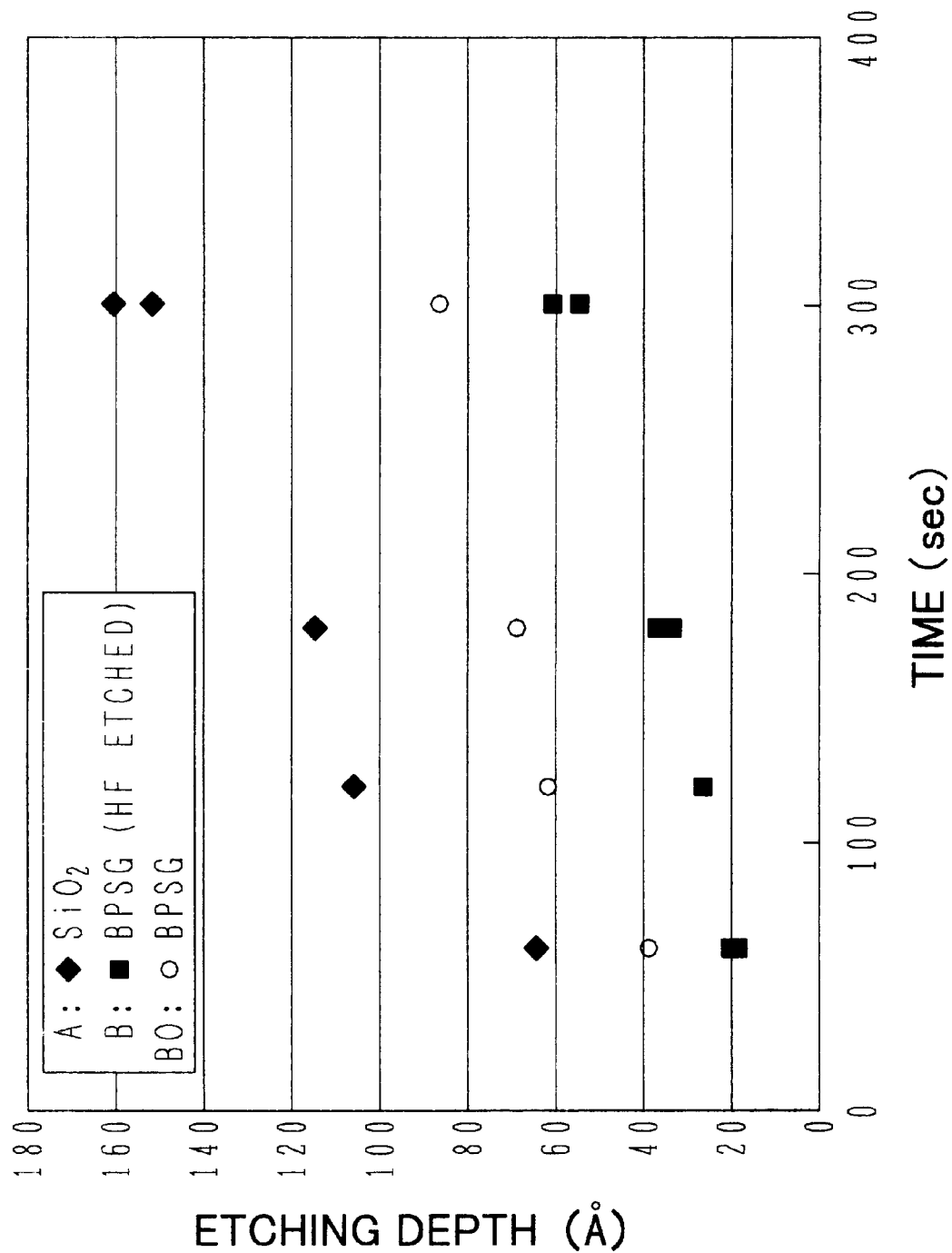

METHOD OF MANUFACTURING SEMICONDUCTOR DEVICE INCLUDING LIGHT ETCHING

This application is based on Japanese Patent Application No. 9-66799 filed on Mar. 19, 1997, the entire contents of which are incorporated herein by reference.

BACKGROUND OF THE INVENTION a) Field of the Invention

The present invention relates to a method of manufacturing a semiconductor device, and more particularly to a method of manufacturing a semiconductor device which includes a light etching process.

b) Description of the Related Art

Circuit elements such as transistors of a semiconductor integrated circuit device are continuously reducing their sizes to improve the degree of integration. As the sizes of circuit elements become small, contact areas are also reduced. Natural or native oxide films (including chemically oxidized films) are easily formed on a silicon surface if the silicon is exposed in ambient air or reacts with chemicals such as acid. If an electrode or the like is formed on the surface of a contact area having such a native oxide film, the contact resistance increases which may result in a degraded performance or defects of the semiconductor device.

Several methods of solving this problem have been proposed, in which, after a native oxide film is removed from a silicon surface, the silicon surface is terminated with hydrogen atoms to retain the stable state of the silicon surface.

For example, these methods include a dry process using hydrogen plasma (A. Kishimoto et al., Jpn. J. Appl. Phys., 29, 2273, 1990), and a dry process using hydrogen atoms or hydrogen radicals (T. Takahagi et al., J. Appl. Phys., 68, 2187, 1990).

With these methods, however, it is known that a silicon surface may be damaged while a native oxide film is removed and the silicon surface is terminated with hydrogen atoms. Techniques have been long desired for removing a native oxide film and terminating the silicon surface with hydrogen atoms without damaging the silicon substrate and other element regions.

There is also proposed a method, wherein hydrogen- and water vapor-containing gas is excited into a plasma state, and $NF_3$ is added to a down-flow of the plasma so as to remove a native oxide film by down flow process (J. Kikuchi et al., Jap. J. Appl. Phys., 33, 1994, JP-A-HEI-6-338478, etc.). With this technique, it is possible to remove a native oxide film by using hydrogen radicals and terminate the silicon surface with hydrogen atoms, without damaging the silicon surface.

Experiments made by the present inventors have demonstrated that when a light etching process using a down-flow of hydrogen- and water vapor-containing plasma is carried out at room temperature or above, the etching rate for a deposited silicon oxide film such as a CVD oxide film, a PSG (phosphosilicate glass) film and a BPSG (borophosphosilicate glass) film, becomes higher than the etching rate for a silicon oxide film formed through oxidation of solid silicon such as a thermally oxidated silicon oxide film and a native oxide film.

For example, while a native oxide film on a silicon surface exposed on the bottom of a narrow contact hole formed through a thick BPSG film is removed, the side wall of the contact hole may be excessively etched.

SUMMARY OF THE INVENTION

It is an object of the present invention to provide a method of manufacturing a semiconductor device capable of etching a silicon oxide film formed through oxidation of solid silicon without damaging the silicon, while maintaining a sufficient etching rate ratio relative to a deposited silicon oxide film. Namely, the etching amount per unit time should be made larger for a silicon oxide film formed by oxidating solid silicon than for a deposited silicon oxide film.

According to one aspect of the present invention, there is provided a method of manufacturing a semiconductor device comprising the steps of: cooling a semiconductor wafer to a predetermined temperature, the semiconductor wafer being mounted on a stage provided with cooling means and having a thin oxide film on the surface thereof; supplying energy to gas containing hydrogen and water vapor to excite the gas into a plasma state; adding gas containing nitrogen fluoride at a region downstream to the plasma where electrons and hydrogen atoms generated in the plasma are almost annihilated; and introducing a flow of a gas added with the gas containing nitrogen fluoride to the surface of the semiconductor wafer to etch the thin oxide film while the semiconductor wafer is cooled to the predetermined temperature.

It has been found that an etching rate changes with the temperature of a semiconductor wafer, when a thin oxide film formed on the semiconductor wafer surface is subjected to a down-flow process of a plasma of a gas containing hydrogen and water vapor, with $NF_3$ being added at a region downstream to the plasma where electrons and hydrogen atoms generated in the plasma are almost annihilated.

For example, if the temperature of the semiconductor wafer is 40° C. or higher, the etching rate of a silicon oxide film formed through oxidation of solid silicon is almost zero. In this case, if the native oxide film is removed completely, a nearby deposited silicon oxide film is possibly etched excessively.

If the temperature of the semiconductor wafer is set to about 25° C. or lower, the etching rate of a silicon oxide film formed through oxidation of solid silicon increases to generally the same as or higher than that of a deposited silicon oxide film.

If the wafer temperature is further lowered to about 22° C. or lower, the etching rate of a silicon oxide film formed through oxidation of solid silicon becomes higher than that of a deposited silicon oxide film.

If the semiconductor wafer is cooled to such a low temperature and the down-flow process is executed, a thin film on the bottom of a contact hole or on other regions can be removed efficiently without excessively etching a deposited silicon oxide film.

As above, if a wafer is maintained to be cooled during a hydrogen plasma down-flow process, a silicon oxide film formed through oxidation of solid silicon can be lightly etched while maintaining a high etching rate ratio relative to a deposited silicon oxide film. Especially, a native oxide film can be etched efficiently.

BRIEF DESCRIPTION OF THE DRAWINGS

FIG. 5 is a graph showing the results of experiments.

DETAILED DESCRIPTION OF THE PREFERRED EMBODIMENTS

Embodiments of the invention will be described with reference to the accompanying drawings. In the following, although specific structures are used illustratively, these structures have no limitative meaning to this invention.

Figure 1:
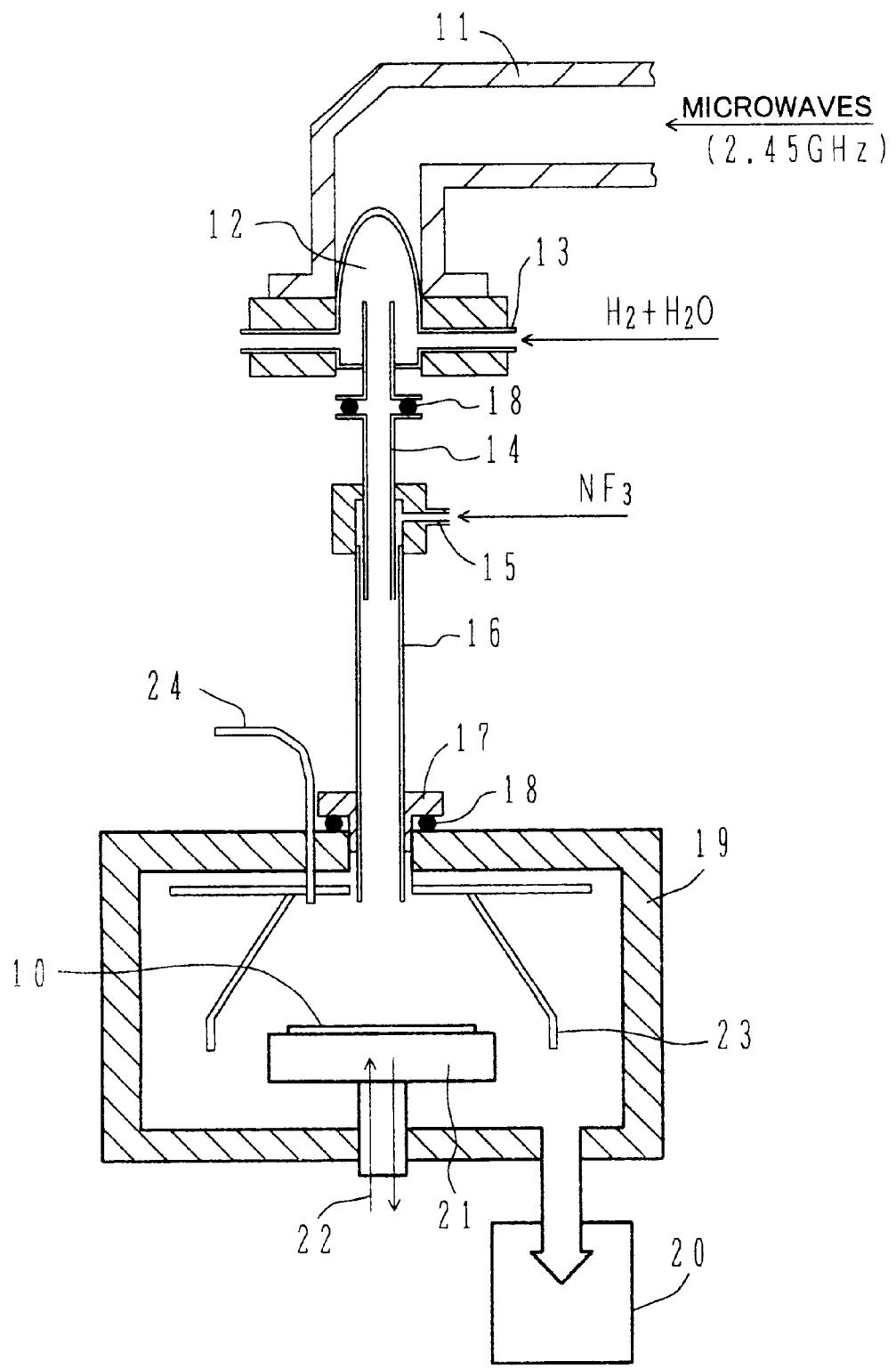
FIG. 1 is a cross sectional view showing the outline of the structure of a light etching system used for practicing embodiments of the invention.

FIG. 1 is a cross sectional view showing the structure of a light etching system for removing a thin oxide film such as a native oxide film. Microwaves at a frequency of 2.45 GHz are introduced via a waveguide 11 into a plasma cavity 12 having a quartz window. $H_2+H_2O$ are introduced into the plasma generating chamber 12 via a gas supply port 13. Two gas supply ports may be used for introducing $H_2$ from one port and $H_2O$ from the other.

A quartz tube 14 is coupled to the lower portion of the plasma cavity 12 by an O-ring 18. Another quartz tube 16 ia coupled to the quartz tube 14 at its lower end. At this coupling position, $NF_3$ is additionally introduced via a gas supply port 15. Down to this $NF_3$ introducing position, ions and electrons have been almost extinguished. For example, this position is in the region where no emission of light by plasma is observed. It is known that introduction of $NF_3$ at such a plasma down-flow position increases the amount of hydrogen radicals.

The quartz tube 16 is coupled to a process chamber 19 by a coupler 17 and an O-ring 18. In this process chamber 19, a stage 21 is disposed which can be cooled with coolant 22 such as water and on which a semiconductor wafer 10 can be placed. The quartz tube 16 and process chamber 19 are so positioned that the plasma down-flow can strike against the surface of the semiconductor wafer 10.

A cover 23 made of quartz surrounds the semiconductor wafer 10. The inner space of the process chamber 19 can be evacuated with a vacuum pump 20. A light transmitting quartz portion of a laser thermometer 24 is inserted down into the process chamber 19 and set above the semiconductor wafer 10.

The laser thermometer 24 radiates a pulsed laser beam and receives a beam reflected from the semiconductor wafer 10. For example, a laser beam radiated from an InGaP laser at an oscillation wavelength of 1.3 μm is introduced via the light transmitting quartz portion into the process chamber 19 and applied to the surface of the silicon semiconductor wafer 10. The applied laser beam is partially reflected on the wafer surface, and the remaining beam progresses into the semiconductor wafer 10.

Part of the beam progressing into the semiconductor wafer 10 is reflected on the bottom surface of the semiconductor wafer 10 and goes out from the top surface thereof. The laser beams reflected on the top and bottom surfaces of the semiconductor wafer 10 interfere with each other at the position above the semiconductor wafer 10 and form a synthesized laser beam. An optical path length in the semiconductor wafer changes with a dielectric constant (refractive index) and thickness of the semiconductor wafer. As the temperature of the semiconductor wafer changes, the dielectric constant changes and its thickness also changes by thermal expansion. Therefore, the condition of interference between the laser beams reflected from the top and bottom surfaces of the semiconductor wafer changes. This interference change is monitored to indirectly measure a temperature change.

A pulse laser beam changes its oscillation wavelength at the rising portion. By monitoring interference inclusive of this wavelength change, a rise or fall of the temperature can also be judged. A calibration curve of interference of the laser thermometer is prepared beforehand by measuring the temperatures of semiconductor wafers manufactured under the same conditions. By using this calibration curve, an averaged temperature of a semiconductor wafer with respect to the whole depth direction thereof can be measured through monitoring an interfered beam.

For example, an interfered beam is monitored by using a pulse laser beam radiated from an InGaP semiconductor laser at an oscillation wavelength of 1.3 μm and a pulse frequency of 50 Hz. In this case, a resolution of about 6° C. per one peak-to-peak duration of an interfering beam for the silicon wafer temperature can be obtained. It is therefore easy to measure an averaged temperature of a semiconductor wafer in a non-contact manner at a precision of 1° C. or lower. Regarding further details of the laser thermometer, reference may be made to U.S. patent application Ser. No. 08/401,689 corresponding to JP-A8-145811, which is incorporated herein by reference.

Silicon wafers were subjected to a down-flow of the plasma using hydrogen and water vapor containing gas with a down-flow injection of $NF_3$, without positively cooling the stage 21. It has been found that the wafer surface temperature rises to about 40° C. in successive processes of twenty five wafers. This temperature rise may be ascribed to the fact that as quartz in the plasma cavity 12 is heated, this thermal energy is transferred by gas or the like and heats the semiconductor wafer 10.

The process gas contains hydrogen which has a good thermal conductivity, therefore thermal energy is likely to be transferred to wafers. It has been found also that as semiconductor wafers are heated to about 40° C., the down-flow process is unable to light etch a native oxide film formed on the surface of a semiconductor wafer.

With these findings taken into consideration, it was inspected by using a light etching system such as shown in FIG. 1, how an etching rate of a silicon oxide film on the semiconductor surface 10 changed with a temperature of the stage 21.

Figure 2:
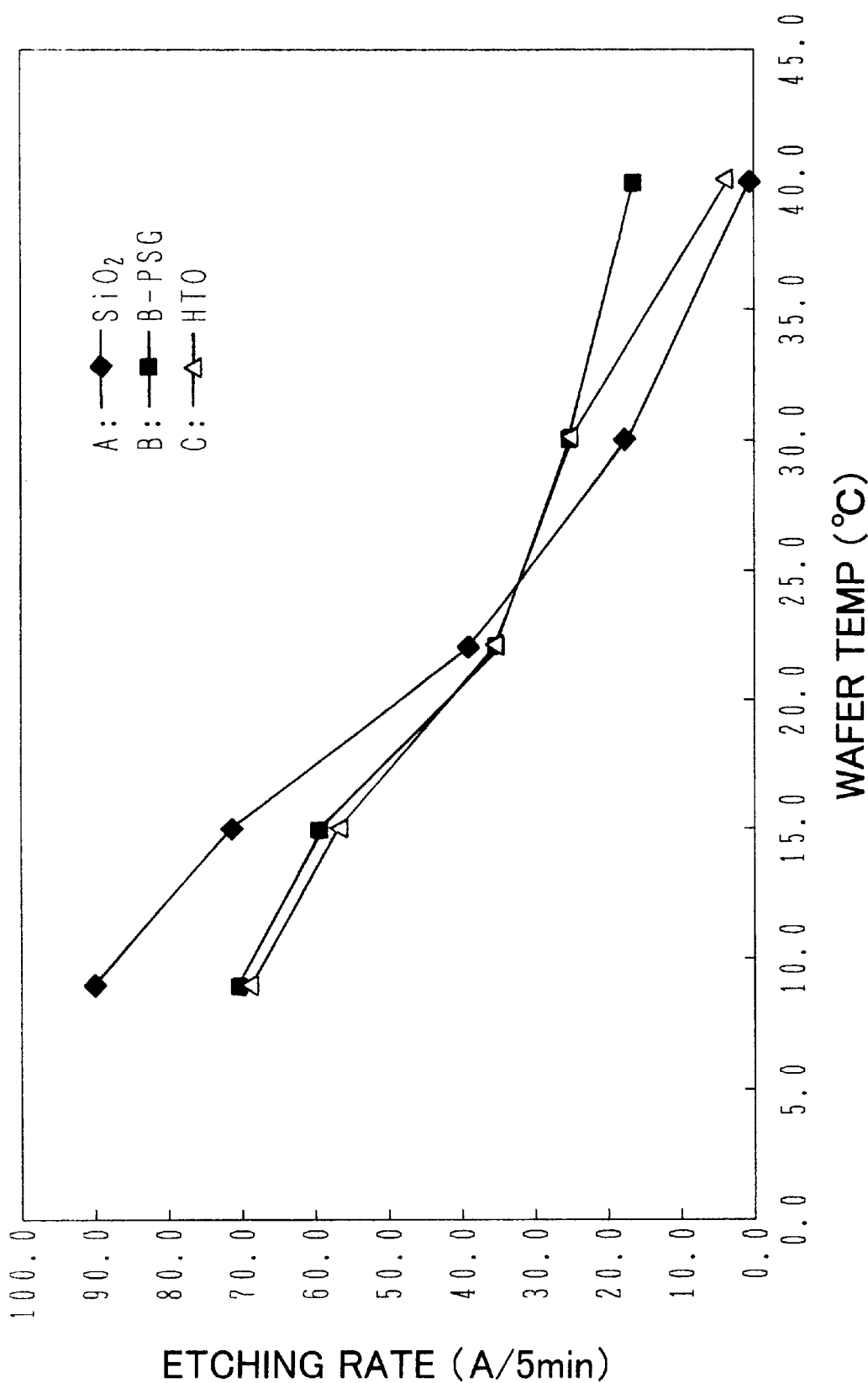
FIG. 2 is a graph showing experimental results of light etching with a down-flow process conducted by the present inventors.

FIG. 2 is a graph showing a relationship between an etching rate of various silicon oxide films and a semiconductor wafer temperature obtained by experiments. The abscissa represents a wafer temperature in OC and the ordinate represents an etched amount (thickness) in angstrom during etching of five minutes. For the measurements, the wafer temperatures were set to 9° C., 15° C., 22° C., 30° C. and 40° C. by controlling the temperature of the wafer stage.

Three kinds of sample oxide films were used: thermal oxide films (indicated by $SiO_2$ in FIG. 2), BPSG films and CVD oxide films (indicated by HTO).

For thermal oxide films, silicon wafers were introduced into a furnace with a dry $O_2$ atmosphere at a flow rate of 12 slm and maintained for 20 minutes at 800° C., the temperature was raised to 1000° C. at 10° C./min, thermal oxide films of about 100 nm thick were formed, and the temperature was lowered to 800° C. at 4° C./min, and the wafers were moved outside of the furnace when the temperature reached 800° C.

For BPSG films, a source gas of TEOS [Si(OC$_2$H$_5$)$_4$], TMOP [PO(OCH$_3$)$_3$] and TEB [B(OC$_2$H$_5$)$_3$] was mixed with carrier gas of N$_2$ and thereafter O$_3$/O$_2$ (ozone containing oxygen) was mixed and flowed from a dispersion head to the surfaces of semiconductor wafers heated to 400° C. Each gas flow rate was set to TEB: 0.8 slm, TMOP: 0.8 slim, TEOS: 1.5 slm, N$_2$: 25 slm, O$_3$: 115 mg/min, and O$_2$: 7.5 slm.

The semiconductor wafers were annealed for 20 minutes at 850° C. in an N$_2$ atmosphere to form BPSG films of 100 nm thick. The B composition of the BPSG film was 3.1 wt % and the P composition was 6.5 wt %. TMS [HSi(OCH$_3$)$_3$], TRIES [HSi(OC$_2$H$_5$)$_3$], TMB [B(OCH$_3$)$_3$], TEFS [FSi (OC$_2$H$_5$)$_3$], TMP [P(OCH$_3$)$_3$], TEOP [PC(OC$_2$H$_5$)$_3$], and etc. may also be used as the source gas.

HTO films ware deposited under the conditions of a pressure of 1 Torr, a substrate temperature of 800° C. and a source gas of SiH$_4$ (40 sccm)+N$_2$O (500 sccm).

Each oxide film of about 100 nm thick formed in the above manner was etched back to a thickness of about 50 nm and processed with the plasma down-flow type light etching system shown in FIG. 1.

A native oxide film is so thin about 2 nm thick. Therefore, although it is possible to check whether the native oxide film was removed by light etching or not, an etching rate cannot be measured. native oxide films include those formed through exposure in atmospheric air and those formed through contact with chemicals. These oxide films have the characteristics very similar to thermal oxide films, as verified from infrared spectroscopy of FTIR. Therefore, the experiment results of thermal oxide films can be applied to native oxide films.

As seen from the graph shown in FIG. 2, the etching rate per five minutes of SiO$_2$ films is almost zero at 40° C., whereas that of BPSG films is 1.5 nm or more. HTO films also have an etching rate of about 0.3 nm although this rate is fairly smaller than that of BPSG films. If an SiO$_2$ film is etched to a desired thickness in a long time, the BPSG film and HTO film are etched far more than the SiO$_2$ film.

As the temperature lowers toward 30° C., the etching rate of an SiO$_2$ film increases and becomes near that of BPSG and HTO films. The etching rates tend to increase as the temperature lowers. However, the etching rate increase depends on the kind of film. At the temperature of 30° C. or lower, the etching rates of BPSG and HTO films are almost equal.

At the temperature of 22° C., the etching rate of SiO$_2$ films becomes larger than that of BPSG and HTO films. From the measurement results at temperatures of 22° C. and 30° C., it can be said that the etching rate of SiO$_2$ films intersects at a temperature of about 25° C. with that of BPSG and HTO films.

As the temperature is lowered to 15° C. and to 9° C., an increase of the etching rate of SiO$_2$ films becomes larger than that of BPSG and HTO films and the difference becomes greater. These etching experiment results were obtained from silicon oxide films formed on flat surfaces. It can be assumed that the etching rate of a native oxide film formed on the bottom of a contact hole is lower than that formed on a broad flat surface.

It can be understood from the above experiment results that a wafer temperature is preferably lowered in order to remove a native oxide film on the bottom of a contact hole efficiently and in a short time. The wafer temperature is preferably about 25° C. or lower, and more preferably 22° C. or lower. If the wafer temperature is lowered further, an etching time can be shortened and an etching ratio of the native oxide film to the deposited silicon oxide film can be increased.

After a native oxide film formed on the bottom of a contact hole is removed, a film deposited on the wafer is removed in a heating chamber by heating treatment. This deposition film can be removed within one minute under the conditions of N$_2$ gas: 1 SLM, pressure: 1 Torr, and wafer temperature: 100° C. Thereafter, it is preferable to deposit an electrode or the like without exposing the wafer in ambient air.

Figure 3:
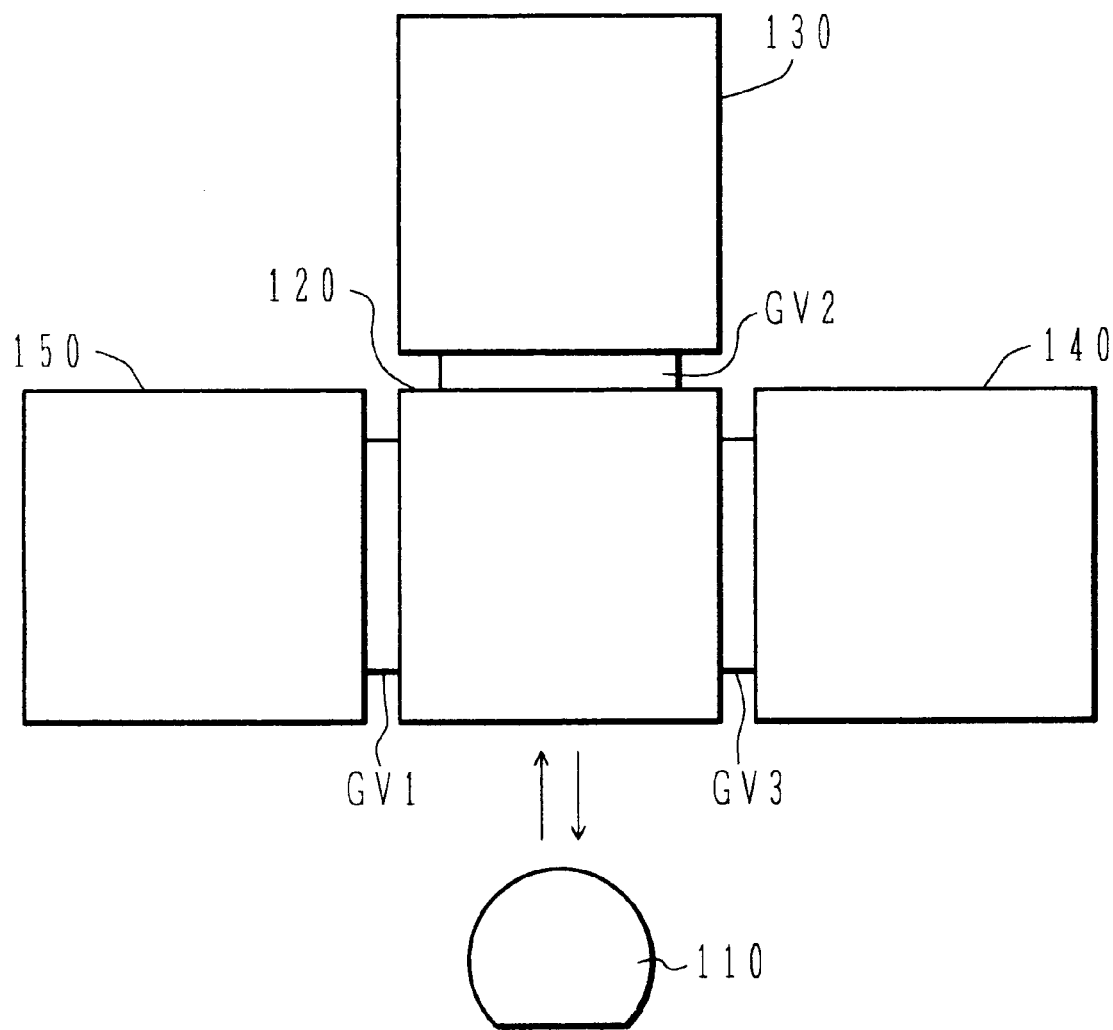
FIG. 3 is a schematic plan view showing an example of the structure of a multi-chamber processing system usable in semiconductor device manufacture of the embodiment.

FIG. 3 is a schematic plan view showing an example of a system for forming a conductive layer which fills a contact hole. A load-lock chamber 120 is coupled via gate valves GV (GV1 to GV3) to a down-flow process chamber 130, a heating chamber 140, and a film forming chamber 150. A wafer can be transported between the chambers without being exposed to the ambient air.

A wafer 110 is transported into the load-lock chamber 120 and then into the down-flow process chamber 130 in which native oxide films are removed, and thereafter a deposition film is removed in the heating chamber 140, and wiring layers are formed in the film forming chamber 150. The down-flow process chamber 130 is equipped with the structure for performing downflow light etching such as shown in FIG. 1.

In the process system shown in FIG. 3, the number of process chambers may be increased as desired. For example, the number of film forming chambers may be increased depending upon the structure of wiring layers to be formed.

FIGS. 4A to 4E are schematic cross sectional views of a semiconductor device illustrating a semiconductor device manufacture method according to an embodiment of the invention.

Figure 4A:
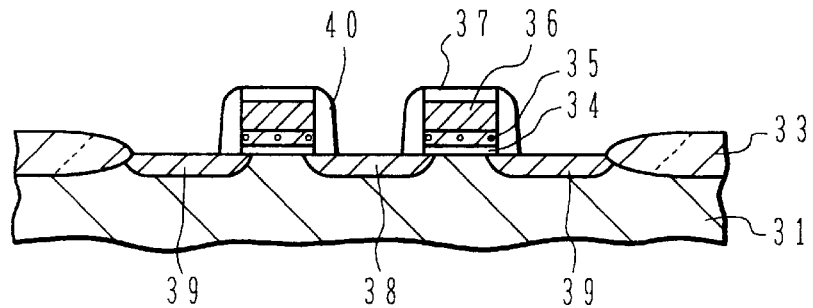
FIGS. 4A to 4E are cross sectional views of a semiconductor wafer illustrating steps of a method of manufacturing a semiconductor device according to an embodiment of the invention.

As shown in FIG. 4A, a field oxide film 33 is formed on the surface of a silicon wafer 31, and thereafter a laminated structure is formed on the surface of the silicon wafer 31. This laminated structure is constituted of a gate oxide film 34, a polysilicon gate electrode 35, a silicide gate electrode 36 such as tungsten silicide, and an insulating layer 37 such as a high temperature CVD oxide film (HTO). The laminated structure is patterned into a gate electrode shape. Side wall spacers 40 of oxide films or the like are formed on the side walls of each gate electrode structure.

After the gate electrode structure and/or side wall spacers are formed, ions are implanted to form n-type source/drain regions 38 and 39. The silicon wafer 31 may be a p-type silicon wafer or a silicon wafer having p-type wells. The insulating layer 37 of the gate electrode structure is used for electrically insulating a wiring layer formed thereon, and may be omitted depending upon the circuit layout.

Figure 4B:
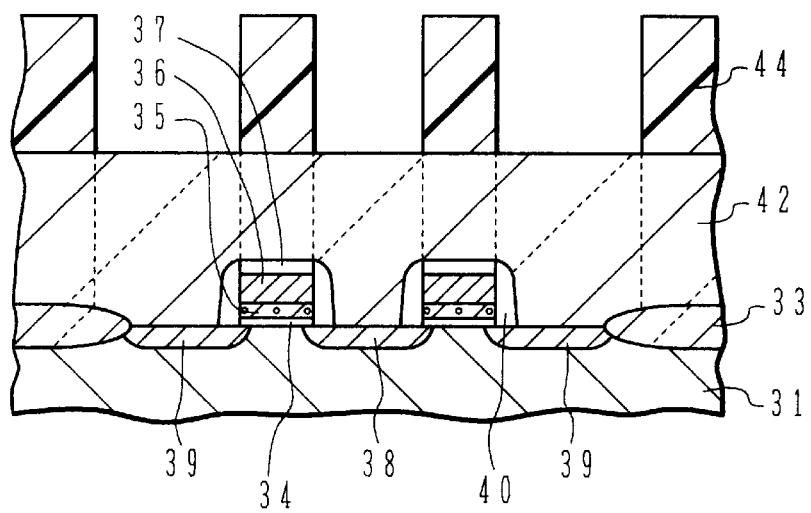

As shown in FIG. 4B, a BPSG film 42 is formed on the semiconductor wafer 31, covering the gate electrode structures. The BPSG film 42 is planarized by reflow or the like. Other planarizing methods such as CMP (chemical mechanical polishing) may also be used. A resist pattern 44 is formed on the planarized BPSG film 42. The resist pattern 44 has openings to be used for forming contact holes reaching the source/drain regions 38 and 39.

In this example, it is assumed to form DRAM cells by connecting a bit line to the middle n-type region 38 and connecting storage capacitors to the n-type regions 39 on both sides of the middle n-type region 38. In such a case, the middle opening is circular having a diameter of, for example, 0.3 μm, and the openings on both sides are elliptical having a shorter diameter of 0.4 μm and a longer diameter of 0.6 μm. The BPSG film 42 is, for example, 1.8 to 2.0 μm thick.

By using the resist mask 44 as an etching mask, the BPSG film is anisotropically etched to form contact holes reaching the n-type regions 38 and 39. Thereafter, the resist mask 44 is removed.

Figure 4C:
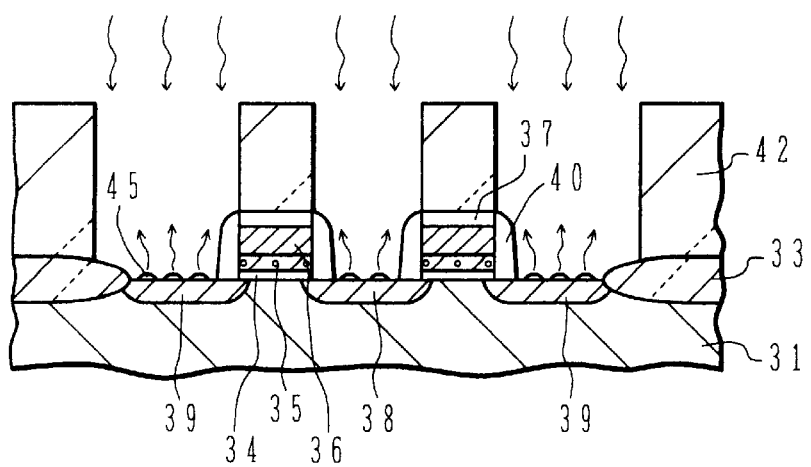

As shown in FIG. 4C, after the contact holes are formed through the BPSG film 42, native oxide films 45 which may be formed on the bottoms of the contact holes are removed by a plasma down-flow process with $NF_3$ being added to a plasma down-flow of gas containing hydrogen and water vapor.

Specifically, in this case, the silicon wafer 31 is placed on the cooled stage in the down-flow process chamber 130 shown in FIG. 3, and down-flow light etching is executed while a wafer average temperature is monitored with a laser thermometer. If the wafer temperature deviates from a predetermined setting range, the cooling amount of the stage is automatically controlled to adjust the wafer average temperature. If the temperature of the wafer 31 is set low, the native oxide films 45 on the bottoms of the contact holes can be efficiently removed while the etching rate of the BPSG film 42 is suppressed.

After the native oxide films on the contact hole bottoms are removed, the deposition film on the wafer is removed in the heating chamber 140, and the silicon wafer 31 is transported to the film forming chamber 150 shown in FIG. 3 which is maintained in a vacuum or non-oxidizing atmosphere, without exposing the silicon wafer 31 to ambient air.

Figure 4D:
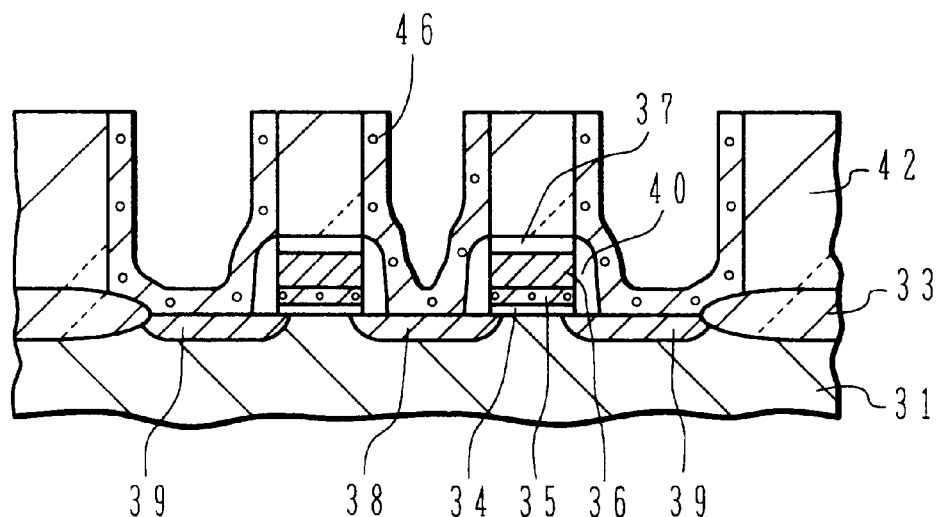

As shown in FIG. 4D, an amorphous silicon layer 46 is deposited on the surface of the silicon wafer 31. This amorphous silicon layer 46 is deposited on the surface of the n-type regions 38 and 39 with the native oxide films being removed, to thereby form good electrical contacts therewith.

If a wiring layer of a Ti/TiN/Al lamination is formed on the silicon surface, a lamination of Ti/TiN is first formed by sputtering in one chamber, and then in another chamber Al is deposited on the TiN layer by sputtering.

Figure 4E:
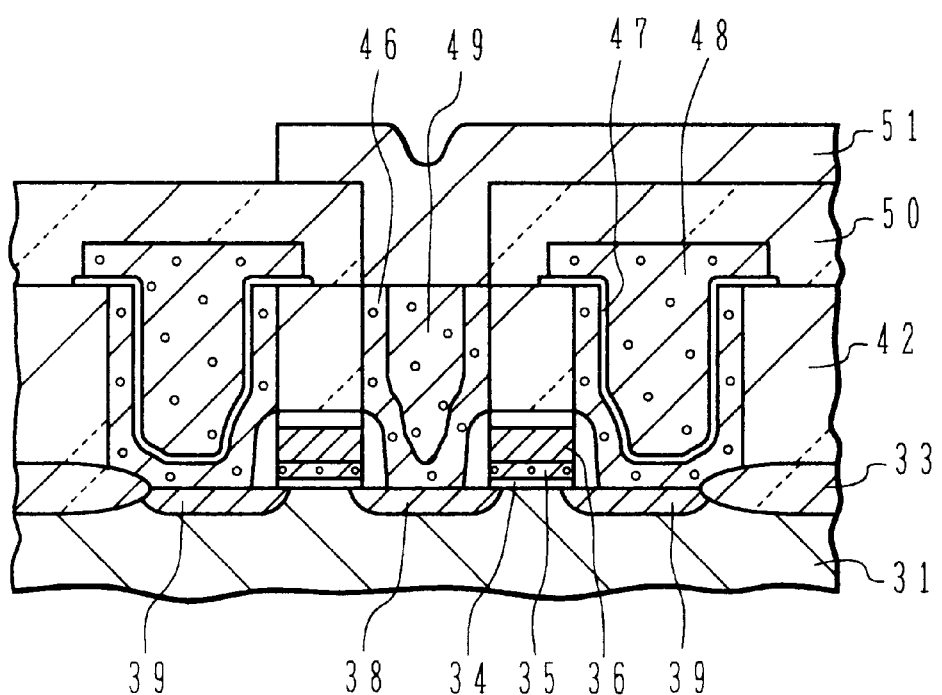

In forming DRAM cells, as shown in FIG. 4E, after the amorphous silicon layer 46 is formed, a capacitor dielectric film 47 of silicon oxide, tantalum oxide or the like is formed through oxidation, nitridation, dielectric film deposition or the like, and then an opposing electrode 48 is formed, for example, through deposition of amorphous silicon. In the contact hole of the n-type region 38, at least the dielectric film 47 is removed and a plug 49 of the same material as the opposing electrode 48 is filled in this contact hole.

Thereafter, another BPSG film 50 is deposited and a contact hole is formed therethrough. A bit line 51 is formed filling this contact hole. In this case, before the bit line 51 is formed, native oxide films on the surfaces of the amorphous silicon layers 46 and 49 are removed by a down-flow process similar to that described above. The bit line is formed by first depositing a Ti layer and a TiN layer through consecutive sputtering and thereafter depositing a W layer to be followed a patterning process of a bit line structure.

In the experiment shown in FIG. 2, an oxide film having a thickness of about 1000 A is first formed, then is etched back to have a thickness of about 500 A, and is then subjected to a plasma down flow treatment. In succeeding research, further new phenomena were found. The deposited film of BPSG, etc. is usually subjected to reflow (melting) treatment at a high temperature, and a following annealing treatment, to densify the film. After such treatment, the BPSG film was found to have a different etching rate in the plasma down flow treatment at its surface and at its inner portions.

FIG. 5 shows the results of the experiment. Three kinds of samples were used: thermal oxide film A similar to the sample A used in the experiment of FIG. 2 (without etch-back treatment); oxide film B similar to the sample B in the experiment of FIG. 2 in which a BPSG film was formed, subjected to melting treatment and then surface portion thereof was removed by etching; and oxide film BO which is formed by depositing a BPSG film, and subjecting the BPSG film to melting treatment. The etching on the sample BO corresponds to etching of the upper surfaces and the top portions of a hole in a BPSG film, and the etching of sample B corresponds to etching of an inner portion of a hole. In the etching, a plasma down flow etching apparatus as shown in FIG. 1 was used. During the etching, wafers are all kept at a 9 ° C. In the-experiment of FIG. 2, the etching amount of the thermal oxide film A at 9° C. was about 90 A/5 minutes, and the etching amount of the BPSG film B at 9° C. was about 70 A/5 minutes.

In FIG. 5, the abscissa represents the etching time in the unit of second, and the ordinate represent the etching depths in the unit of Angstrom. The etching depth was measured at etching times of 1, 2, 3, and 5 minutes.

Since the wafer temperature was kept at 9° C., the etching amount of the thermal oxide film A is about 160 A/5 minutes, which is larger than the etching amount of about 60 A/5 minutes of the BPSG film B and the etching amount of about 90 A/5 minutes of the BPSG film BO. Here, the difference in the etching rate from those of FIG. 2 is considered to have arisen from the difference in the etching conditions.

It is to be noted that the etching amount of BPSG film BO which was as formed and melted is far larger than the etching amount of the BPSG film B which was formed, melted, and is subjected to removal of a surface layer.

In the range of the etching time of 2 minutes or less, the difference in the etching depth for the samples B and BO apparently increases with the increase in the etching time. In the range of the etching time longer than 2 minutes, the difference in the etching depth for the samples B and BO does not appear to change significantly. Therefore, the region of high etching rate would be the region of a thickness about 60 A at the surface of the BPSG film. When the film forming conditions, etc. are varied, the region having a high etching rate would change, but will be in the range of a thickness of 100 A or less.

From the above experiment results, it was found that the etching rate of the BPSG film in the plasma down flow treatment differs in the surface portion which would have a thickness of 100 A or less, and the deeper inner portion below the surface portion. The etch rate in the surface portion is far larger than the etching rate in the inner portion. In other words, the melted BPSG film is easy to be etch in the neighborhood of the surface, and is hard to be etch in the inner portion.

Considering the case where a contact hole is first formed, and then native oxide films at the bottom surface of the contact hole is removed by etching, the BPSG film at the uppermost portion of the contact hole (for example, from the surface to a depth of about 100 A) is easy to etch, and the side surfaces of the contact hole at lower portions are hard to be etch.

Figure 6A:
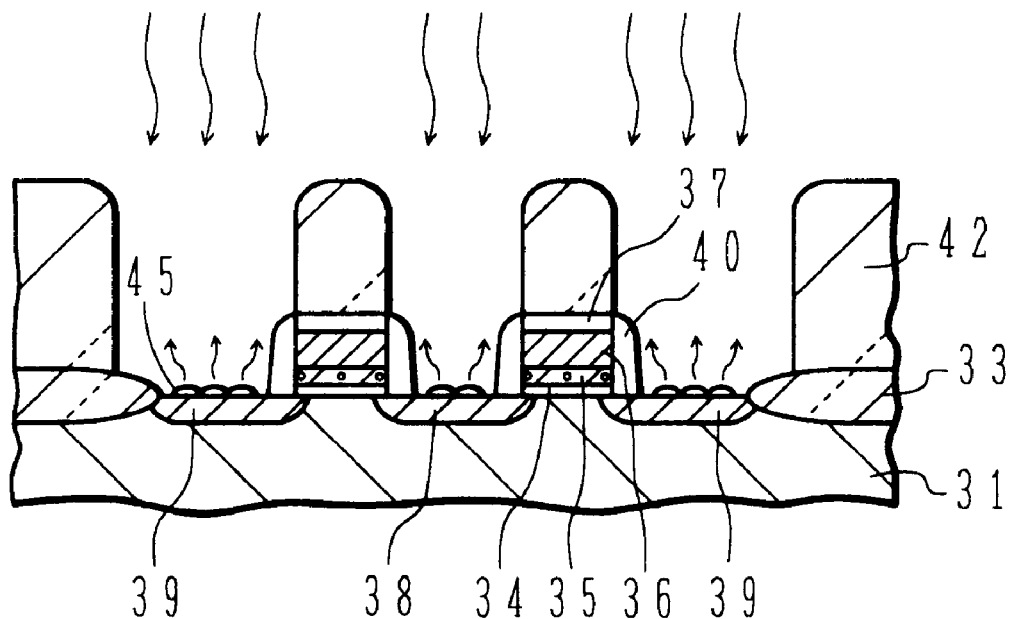
FIGS. 6A and 6B are cross sectional views of a semiconductor wafer illustrating another embodiment of the invention.
Figure 6B:
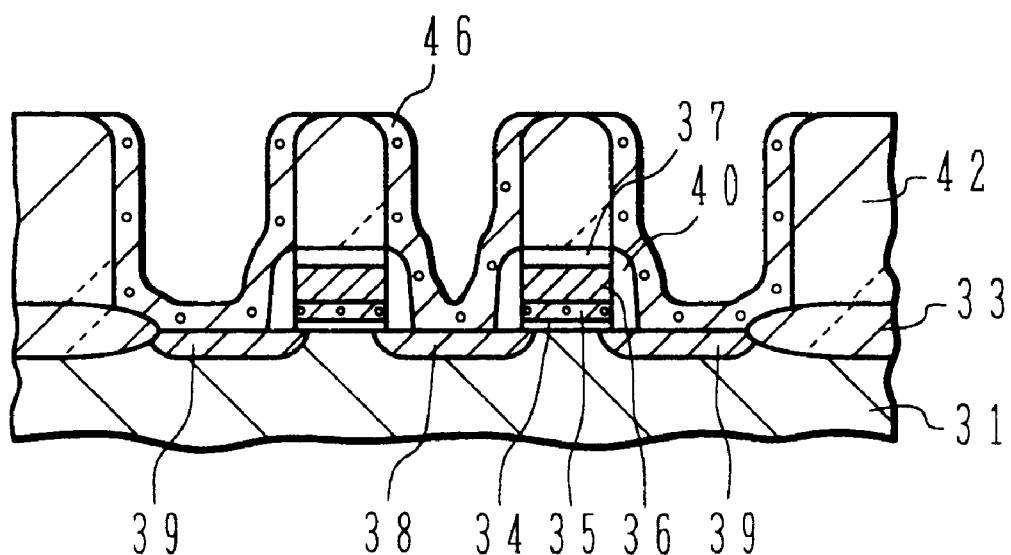

FIGS. 6A and 6B show another embodiment positively utilizing this phenomenon. FIG. 6A shows the step corresponding to the step shown in FIG. 4C. As shown in FIGS. 4A and 4B, a field oxide film, a gate electrode structure, source/drain regions are formed on a silicon wafer, and then a BPSG film 42 is formed to cover the gate electrode structure, and then is subjected to melting treatment and annealing treatment. A resist pattern is formed on the BPSG film having a planarized surface, as shown in FIG. 4B, a contact hole is formed by anisotropic etching.

Thereafter, the resist mask is removed by ashing, etc. Further, the wafer is subjected to wet cleaning for removing particles and contamination. This wafer is subjected to hydrogen down flow treatment.

FIG. 6A shows the step of light etching by hydrogen down flow treatment. A light etching apparatus as shown in FIG. 1 is used, wherein $NF_3$ gas is added to a down flow position of a plasma formed of a gas containing hydrogen and water vapor, and the silicon wafer is subjected to down flow treatment at a further down stream position to remove native oxide films 45.

In this light etching, the BPSG film 42 shows a relatively large etching rate at a portion near the surface to round the edge of the contact hole. In deeper portions of the BPSG film, the etching rate is low. Therefore, the degree of varying the dimensions in a deeper portion of the contact hole is small. Therefore, it is possible to round the edge at the top of the contact hole, while keeping the diameter of the contact hole substantially at a designed value.

After this light etching step, the silicon wafer is transported into a heating chamber and subjected to removal of deposition which occurred in the light etching step, by heating. Thereafter, the wafer is transported into an electrode forming chamber.

FIG. 6B shows the electrode forming step similar to FIG. 5D. After a polycrystalline silicon layer is formed on the wafer and recessed portions are filled with resist, etc., the surface is lapped by CMP, etc., to expose the surface of the BPSG film 42, and separate the polysilicon layers 46 associated with respective contact holes.

In this step, other conductive layers, for example, aluminum or aluminum alloy layer, laminates of Ti/TiN/Al(Al alloy), etc., may also be formed in place of the polysilicon layer. Since the edge at the top of the contact holes are rounded, the coverage of the electrode layer is improved.

Although a description has been made on the case where removal of native oxide films on a silicon surface and rounding of the top edge of a contact hole are simultaneously performed, the above-mentioned technique can be applied in the case in which only the diameter at the top edge of a contact hole is enlarged. For example, the diameter of the top portion of a contact hole for an upper level wiring in a multi-level wiring structure can be enlarged.

In the case where it is desired that the cross-sectional shape of a contact hole is not changed, the following method can be employed. An oxide film, a gate electrode, etc., are formed on a semiconductor wafer, and a BPSG film is deposited covering these structures. The BPSG film is melted, and annealed to improve the film quality. Thereafter, a surface layer of the BPSG film is removed by wet etching based on fluoric acid. By this wet etching treatment, a surface layer having a high etching rate in the BPSG film is removed. It is sufficient to remove a surface layer of a thickness 100 A or more. The remaining BPSG film will show uniform etching rate to the light etching by hydrogen plasma down flow treatment, irrespective of the depth.

A resist pattern is formed on the surface of the BPSC film, the surface layer of which has been removed, as shown in FIG. 4B, a contact hole is formed, native oxide films are removed and an electrode layer is formed, similar to the foregoing embodiments.

In this embodiment, a surface layer of the melted BPSG film is preliminary removed. Therefore, the etching rate of the BPSG film becomes uniform irrespective of the depth, and is more difficult to be etched relative to native oxide films. Thus, it is possible to light etch native oxide films, without changing the shape of the sidewall of the contact hole.

Although a description has been made on the cases where a contact hole is formed after a surface layer of the BPSG film is etched, a contact hole may be formed first and a surface layer of the remaining BPSG film may then be removed by wet etching using fluoric acid, etc.

In the above description, a native oxide film formed on the silicon surface is removed, and a conductive layer is formed on the silicon surface. A native oxide film may be formed on a conductive surface other than silicon. Similar light etching processes can be executed in these cases also. It will be obvious to those skilled in the art that the structure of a semiconductor device is not limited to the above.

The present invention has been described in connection with the preferred embodiments. The invention is not limited only to the above embodiments. It will be apparent for those skilled in the art that various modifications, improvements, combinations, and the like can be made.

What is claimed is:

1. A method of manufacturing a semiconductor device comprising the steps of:

(a) cooling a semiconductor wafer to a predetermined temperature less than 40° C., the semiconductor wafer mounted on a stage provided with a cooling device and having a first silicon oxide film on a surface of the wafer;

(b) supplying energy to a first gas containing hydrogen and water vapor to excite the first gas into a plasma state;

(c) adding as a second gas nitrogen fluoride downstream to a flow of the first gas in the plasma state; and (d) introducing the flow of the first gas and nitrogen fluoride to the surface of the semiconductor wafer, and maintaining the predetermined temperature of the semiconductor wafer to control the etching rate of the first, silicon oxide film on the semiconductor wafer.

2. A method according to claim 1, wherein the predetermined temperature is about 0° C. to 25° C.

3. A method according to claim 2, wherein the predetermined temperature is about 22° C. or lower.

4. A method according to claim 1, further comprising the step of:

(e) monitoring an averaged temperature of the semiconductor wafer by applying a laser beam to the semiconductor wafer and measuring interference between laser beams reflected from top and bottom surfaces of the semiconductor wafer.

5. A method according to claim 2, further comprising the step of:

(e) monitoring an averaged temperature of the semiconductor wafer by applying a laser beam to the semiconductor wafer and measuring interference between laser beams reflected from top and bottom surfaces of the semiconductor wafer.

6. A method according to claim 3, further comprising the step of:

(e) monitoring an averaged temperature of the semiconductor wafer by applying a laser beam to the semiconductor wafer and measuring interference between laser beams reflected from top and bottom surfaces of the semiconductor wafer.

7. A method according to claim 4, further comprising the step of:

(f) feeding the monitored averaged temperature of the semiconductor wafer back to the cooling device of the stage to automatically maintain the averaged temperature of the semiconductor wafer at the predetermined temperature.

8. A method according to claim 5, further comprising the step of:

(f) feeding the monitored averaged temperature of the semiconductor wafer back to the cooling device of the stage to automatically maintain the averaged temperature of the semiconductor wafer at the predetermined temperature.

9. A method according to claim 6, further comprising the step of:

(f) feeding the monitored averaged temperature of the semiconductor wafer back to the cooling device of the stage to automatically maintain the averaged temperature of the semiconductor wafer at the predetermined temperature.

10. A method according to claim 1, wherein the semiconductor wafer includes a second, silicon oxide film formed with an opening.

11. A method according to claim 2, wherein the semiconductor wafer includes a second, silicon oxide film formed with an opening.

12. A method according to claim 3, wherein the semiconductor wafer includes a second, silicon oxide film formed with an opening.

13. A method according to claim 7, wherein the semiconductor wafer includes a second, silicon oxide film formed with an opening.

14. A method according to claim 8, wherein the semiconductor wafer includes a second, silicon oxide film formed with an opening.

15. A method according to claim 9, wherein the semiconductor wafer includes a second, silicon oxide film formed with an opening.

16. A method according to claim 10, wherein the second, silicon oxide film is a BPSG film.

17. A method according to claim 11, wherein the second, silicon oxide film is a BPSG film.

18. A method according to claim 13, wherein the second, silicon oxide film is a BPSG film.

19. A method according to claim 14, wherein the second, silicon oxide film is a BPSG film.

20. A method according to claim 15, wherein the second, silicon oxide film is a BPSG film.

21. A method according to claim 1, wherein said semiconductor wafer includes a BPSG film formed with a contact hole therethrough, and said first, silicon oxide film underlies said BPSG film and is exposed in said contact hole.

22. A method according to claim 21, further comprising, after said step (a), the steps of:

depositing said BPSG film; and melting said BPSG film.

23. A method according to claim 22, further comprising, after said step (f), the step of (g) etching a surface layer of said melted BPSG film.

24. A method according to claim 23, wherein said step (g) includes wet etching using fluoric acid.

25. A method according to claim 23, wherein said step (g) etches a thickness of 100 A or more of said BPSG film.

26. A method of manufacturing a semiconductor device, comprising the steps of:

(a) introducing hydrogen containing gas into a plasma generator of a semiconductor manufacturing apparatus;

(b) exciting said hydrogen-containing gas in the plasma generator;

(c) introducing nitrogen fluoride into the gas down stream from said plasma generator, and;

(d) while maintaining a temperature of a semiconductor substrate at a further downstream position at a predetermined temperature less than 40° C., etching a BPSG film on the semiconductor substrate, said BPSG film having a connection hole formed therethrough, and removing a native oxide film also on the substrate, wherein an etch rate of an upper surface of the hole is thereby controlled to be different than an etch rate of an inner portion of the hole.

27. A method according to claim 26, further comprising before said step (a) the steps of:

subjecting said BPSG film to melting treatment and annealing treatment; and thereafter, etching said connection hole by anisotropic etching.

28. A method according to claim 26, further comprising, before said etching of the BPSG film, the step of pre-etching said BPSG film by an etching treatment adapted for the native oxide film.

29. A method according to claim 28, further comprising before said pre-etching step, the step of subjecting said BPSG film to a melting treatment.

30. A method according to claim 28, wherein said pre-etching treatment is wet etching using fluoric acid.

31. A method according to claim 28, wherein said pre-etching step etches a thickness of 100 A or more of the BPSG film.

32. A method according to claim 26, wherein the predetermined temperature is about 0° C. to 25° C.

33. A method according to claim 32, wherein the predetermined temperature is about 22° C. or lower.

* * * * *

UNITED STATES PATENT AND TRADEMARK OFFICE
CERTIFICATE OF CORRECTION

PATENT NO. : 6,063,300
DATED : May 16, 2000
INVENTOR(S) : Miki Suzuki et al.

It is certified that error appears in the above-identified patent and that said Letters Patent is hereby corrected as shown below:

Column 10,
Line 35, after "first" insert -- , --.

Signed and Sealed this

Ninth Day of October, 2001

Attest:

NICHOLAS P. GODICI
Attesting Officer
Acting Director of the United States Patent and Trademark Office